(12) United States Patent
Bird

(10) Patent No.: US 7,702,113 B1
(45) Date of Patent: Apr. 20, 2010

(54) PARAMETRIC ADAPTIVE ROOM COMPENSATION DEVICE AND METHOD OF USE

(76) Inventor: Richard Rives Bird, P.O. Box 5548, Coralville, IA (US) 52241-0548

( * ) Notice: Subject to any disclaimer, the term of this patent is extended or adjusted under 35 U.S.C. 154(b) by 590 days.

(21) Appl. No.: 10/932,896

(22) Filed: Sep. 1, 2004

Related U.S. Application Data

(60) Provisional application No. 60/499,468, filed on Sep. 2, 2004.

(51) Int. Cl.
*H04R 29/00* (2006.01)
(52) U.S. Cl. .............................. 381/58; 381/56; 381/59; 381/101; 381/103; 381/303
(58) Field of Classification Search ................. 381/300, 381/58–59, 61, 303, 101–103; 700/94
See application file for complete search history.

(56) References Cited

U.S. PATENT DOCUMENTS

| | | | | |
|---|---|---|---|---|
| 6,078,670 A | * | 6/2000 | Beyer | 381/57 |
| 7,123,731 B2 | * | 10/2006 | Cohen et al. | 381/303 |
| 7,526,093 B2 | * | 4/2009 | Devantier et al. | 381/59 |
| 2003/0099365 A1 | * | 5/2003 | Karjalainen et al. | 381/61 |
| 2003/0179891 A1 | * | 9/2003 | Rabinowitz et al. | 381/103 |
| 2005/0031129 A1 | * | 2/2005 | Devantier et al. | 381/58 |
| 2005/0031135 A1 | * | 2/2005 | Devantier et al. | 381/59 |
| 2005/0031143 A1 | * | 2/2005 | Devantier et al. | 381/300 |

\* cited by examiner

*Primary Examiner*—Xu Mei
*Assistant Examiner*—Disler Paul
(74) *Attorney, Agent, or Firm*—Simmons Perrine Moyer Bergman PLC

(57) ABSTRACT

The present invention a parametric equalizer and a method for correcting for room mode problems. The inventive device is an analog based, parametric notch filtration system with at least two-channels. The inventive equalizer has sufficient bands, bandwidth, attenuation, and flexibility to accurately address room mode problems. The inventive system allows for continuous fine adjustment of attenuation and bandwidth. The method involves measuring, evaluating, and calculating what variables need to be used to correct the room mode issue for a particular room and then correcting the identified variables.

13 Claims, 16 Drawing Sheets

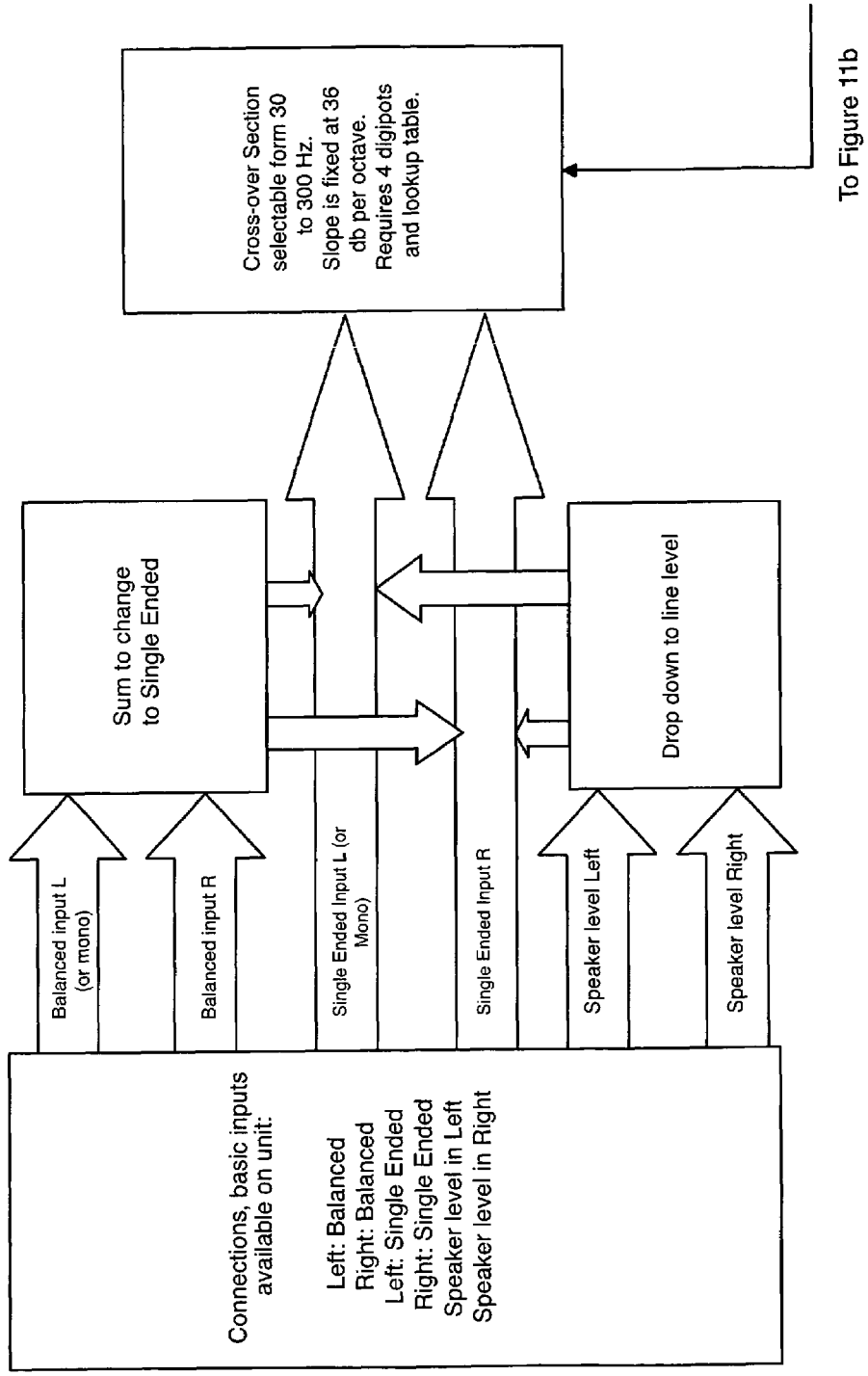

PARAMETRIC ADAPTIVE ROOM COMPENSATION DEVICE AND METHOD OF USE

This application claims the benefit of U.S. Provisional Application 60/499,468 filed Sep. 2, 2004. U.S. Provisional Application 60/499,468 is hereby incorporated by reference.

BACKGROUND OF THE INVENTION

1. Field of the Invention

The present invention relates to home audio systems. More specifically it relates to a parametric equalizer to compensate for room modes.

2. Description of the Related Art

To enjoy music, many people set up listening rooms in their homes. Ideally, a room is specifically designed for to be a listening room at the time the home is built. However, most people do not have the luxury of a custom designed, dedicated listening room. For most people the listening room is retrofit into an existing home. Often by using an existing room. Further, the room designated to be the listening room often serves many purposes such as the family room, den or an office in addition to being a listening room.

High-end speakers and audio components have the capability of providing a near flat response through the audible range (about 20 Hz to 20 KHz). However, because most listening rooms were not designed specifically for this purpose and because these rooms are often multifunctional, the capabilities of the audio components often exceed those of the listening environment.

The sound interacts with the walls; parallel walls in particular are especially problematic, windows, doorways, and furniture. When the listening room was not designed with audio in mind, undesirable peaks and dead areas often result.

Retrofitting a listening room into an existing room of a house often means living with the existing room plan—including doorways, windows, walls and ceiling. Further, because the room may serve many functions, the listener may be further constrained in the selection of surface coverings, furniture materials, furniture location and/or speaker location.

Most rooms are designed with parallel surfaces—walls, floor, and ceiling. Given the size of a room in a typical home, usually less than 35 feet, the significant problems caused by the room dimensions are in the bass range. Thus, there is a need for a system corrects for undesirable peaks in the base frequencies.

Most prior art systems are digital. The problem with digital filters is two-fold. First, the filters required for this type of application are very long convolution filters in the digital domain and lead to a variety of artifacts that are not desirable for high-end home enthusiasts. Second, some formats, including vinyl, super audio CD (SACD) and DVD-A are extremely high resolution and suffer in quality drastically when converted into the digital domain and then back out into analog. There is a need for a system that corrects for undesirable peaks in the base frequencies while being transparent in the audio system. There is a need for a system that preserves the purity of analog recordings.

One prior art system is a digital room compensation system that attempts to deal with room modes and with other unwanted aspects including high frequency filtering and phase alignment. However, because it is digital system does not preserve the purity of an analog recording and thus is not desirable.

Another prior art system uses a pre-amplifier with some digital room correction circuitry. However, it does not fully address the problem caused by room modes.

Another prior art system utilizes an analog equalizer that has fixed Q (widths) and variable center frequencies. Different number of center frequencies may be adjusted for. However, the device is noisy. The addition of noise is undesirable in a listening room.

Another prior art system uses a single channel filter. A single channel of correction is inadequate to address problems caused by room modes.

None of the prior art systems are full parametric systems. None of the prior art systems allow for continuous fine adjustment of the width of the curve. There is a need for a fully parametric system that allows for continuous fine adjustments of the width of the curve.

There is a need for an analog based, parametric notch filtration system with at least two-channels, that has enough bands, bandwidth, attenuation, and flexibility to accurately address room mode problems. Further, there is a need for a system that allows continuous fine adjustment of attenuation and bandwidth.

To accurately correct for room mode problems, it is important to being able to measure, evaluate, and calculate what variables need to be used to correct the room mode issue. Since nearly every room is different, the variables used will be different.

BRIEF SUMMARY OF INVENTION

In listening rooms there are a variety of sonic anomalies that need to be corrected. A perfect listening room has uniform decay times (RT-60 measurements) and near flat frequency response. Rooms that were designed as listening rooms at the time they were built have the advantage of being designed to perform in this manner. However, for home enthusiasts, this is rarely the case. Most listening rooms were not originally intended as dedicated or even non-dedicated listening rooms. The result of retrofitting an existing room into a listening room is often a compromised listening environment.

There are several things that dictate how a listening room will perform:

Geometry: Size and dimensions of the listening room

Construction: Rigidity and reflective nature of the room surfaces

Absorption: Items within the room that absorb sound

Diffusion: Items within the room that diffuse sound

Resonators: Items within the room that resonate, i.e. take in one frequency and give off a variety of frequencies at lower levels.

Existing structures do not typically allow for a change in geometry or construction. Unlike mid- and high frequencies, problems created by low frequencies cannot be effectively attenuated with absorbers and/or diffusers. Thus, absorption and diffusion do little or nothing for frequencies below 250 Hz without very large devices, such as a wall of absorbers or diffusers that are three feet deep. Resonators can be tuned to any frequency desired, but they are complex, large, and difficult to build.

While geometry and construction primarily dictate the room response below 500 Hz, they are nearly impossible for most homeowners to change. The distance between two parallel walls within a room accentuates particular frequencies in the room. The first accentuated frequency known as the first axial mode is found at the distance that ½ of a wavelength travels in one second between the two walls. Because rooms often have parallel walls for both width and length, there are typically at least two first axial modes—one corresponding to the lengths of the room and the other corresponding to the width of the room. In addition, there are second, third, etc. primary modes as well as tangential and oblique modes.

The speed of sound is approximately 1130 feet per second. As an example, in a room where two parallel walls are 15 feet apart, the first axial mode for those walls will be: $1130*\frac{1}{2}/15=37.7$ Hz. Thus, there will be a rise in energy at this frequency.

It is difficult to predict how big the rise will be or how narrow the band that this rise occurs will be. This depends on, for example, how rigid the walls are and how well they hold energy. A concrete block building might have as much as a 15 db peak and a very narrow bandwidth, whereas a single layer gypsum and 2×4 construction might only have a 6 db peak and a much wider range.

The problems caused by the room geometry are difficult to address because the modes can, and usually do interact with one another. Suppose the length of the example room is 30 feet long. The first axial mode of the length is $(1130*\frac{1}{2})/30=18.8$ Hz. Fortunately, this first axial mode is of such a low frequency that few speakers have significant output at this frequency. Thus, it is not much of a concern. However, some of its harmonics such as the second axial frequency may be of concern. The second axial mode is found at the distance a full wavelength (2 halves) travels in one second and thus would be $2(1130*\frac{1}{2})/30$ or 37.7 Hz. This is the same frequency as the room width's first axial mode. As a result, the peak at this frequency will be even stronger. There are also tangential modes, which are a combination of four surfaces and oblique modes that combine all 6 surfaces. Fortunately, oblique modes are generally very weak but tangential modes can be significant.

The problem with room modes is they make the reproduction of sound seem very "boomy". There's too much bass energy and its sound is very poorly defined. Not only this, when the bass energy is out of balance it impedes on the clarity of the mid- and upper-frequencies.

The present invention deals with these bass energies, accurately and unobtrusively without the need for room construction. The only practical way of dealing with this issue without construction is to deal with the signal and compensate for the bass energies. However, this is not as easy. High-resolution systems can reveal the limitations of any addition in the signal path. The present invention addresses the bass energies while being invisible in the audio system.

The present invention is an analog based, parametric notch filtration system with at least two-channels. It has enough bands, bandwidth, attenuation, and flexibility to accurately address room mode problems. The inventive system allows for continuous fine adjustment of attenuation and bandwidth.

The present invention is a method of accurately correcting for room mode problems. The method involves measuring, evaluating, and calculating what variables need to be used to correct the room mode issue for a particular room and then correcting the identified variables.

BRIEF DESCRIPTION OF THE DRAWINGS

FIGS. 11a-11c are a flow diagram of an alternative preferred embodiment of the parametric equalizer.

DETAILED DESCRIPTION OF THE INVENTION

Figure 1:
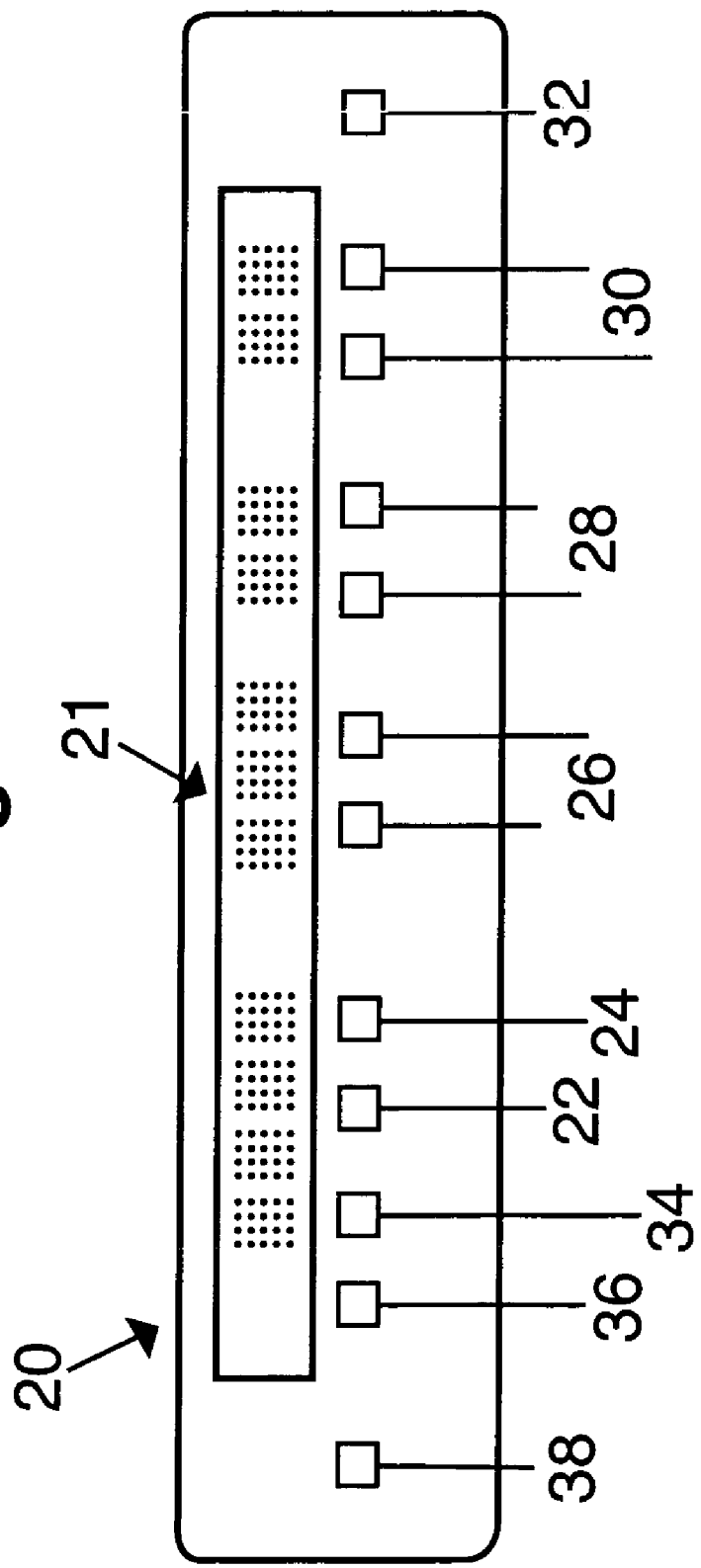
FIG. 1 is a front view of the parametric adaptive room compensation (device) device.
Figure 2:
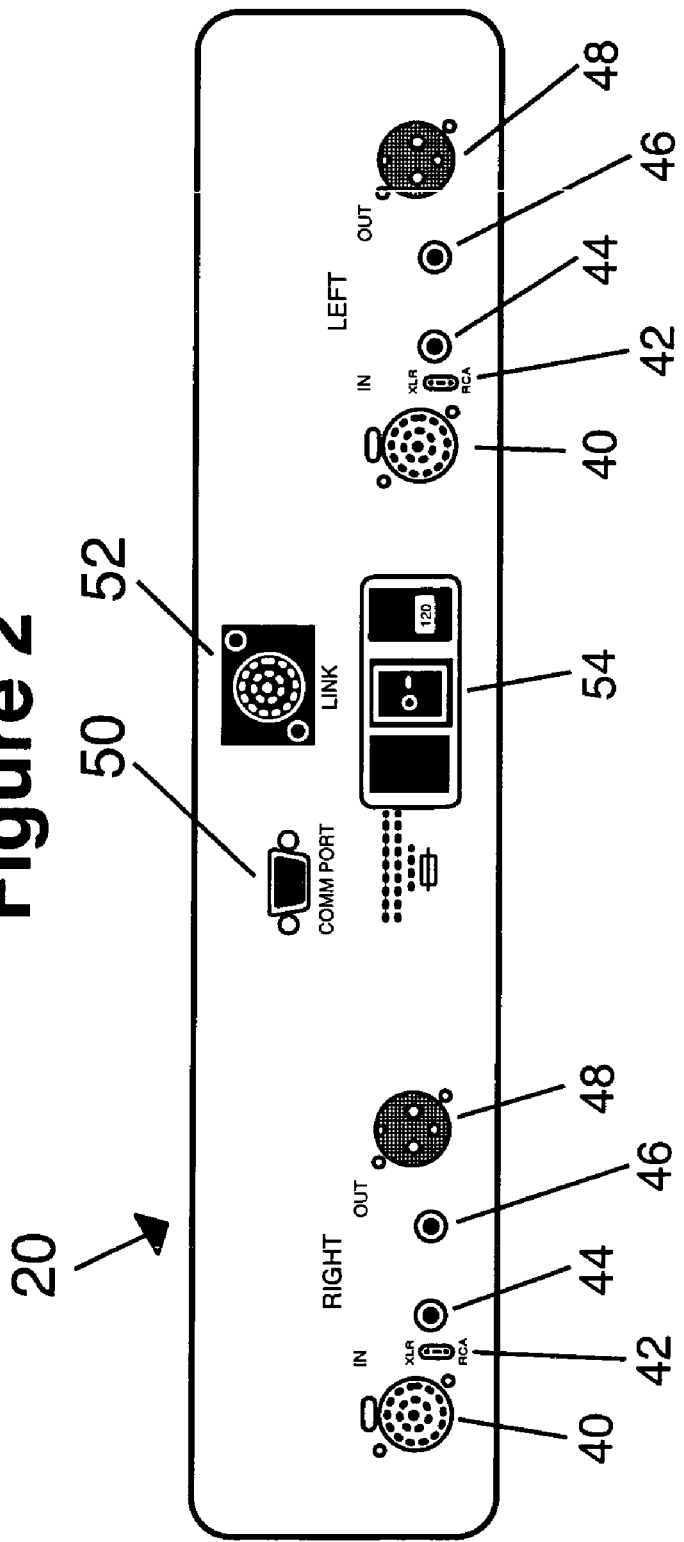
FIG. 2 is a rear view of the parametric adaptive room compensation device.
Figure 3:
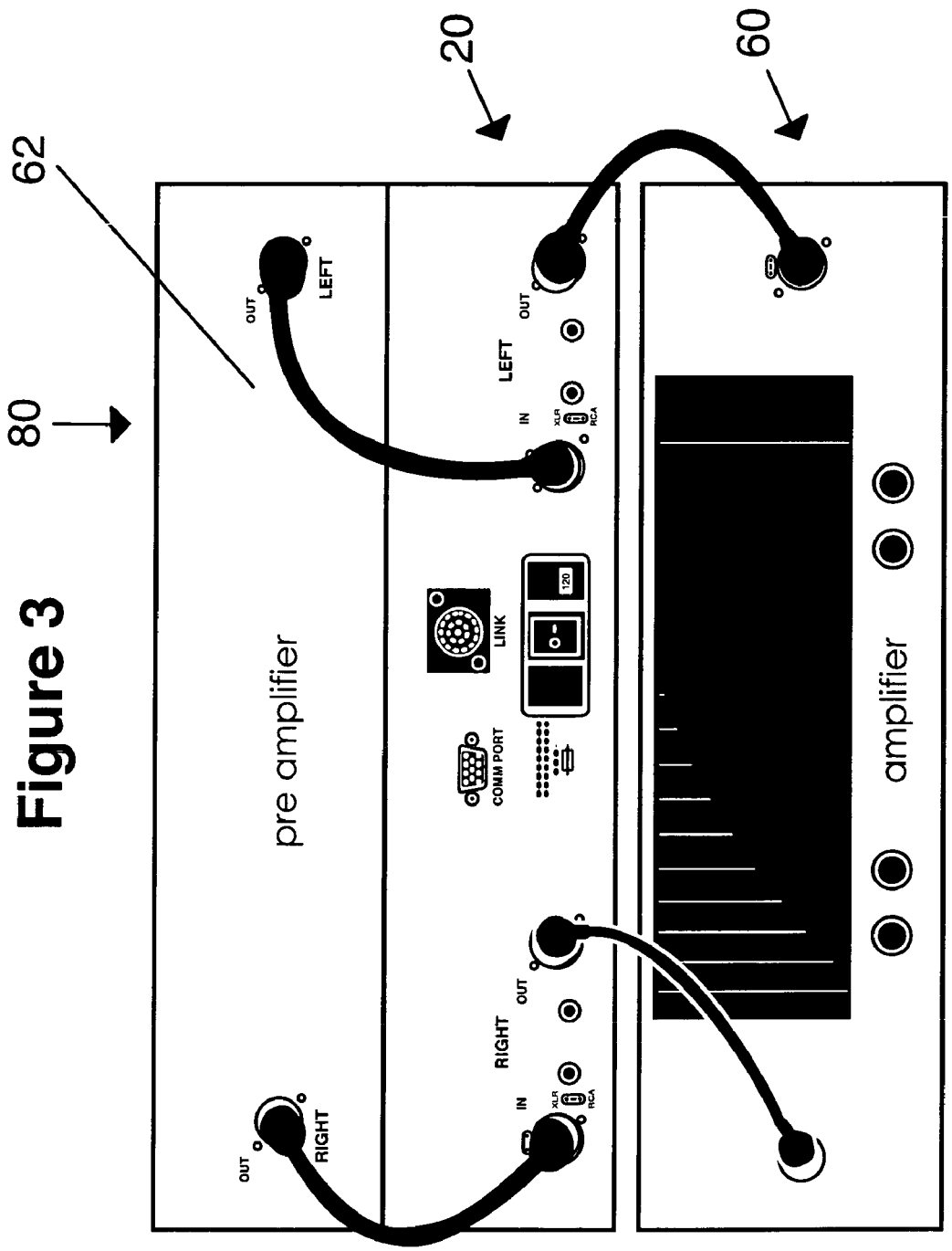
FIG. 3 is a preferred method of connecting the device in a home audio system.
Figure 4:
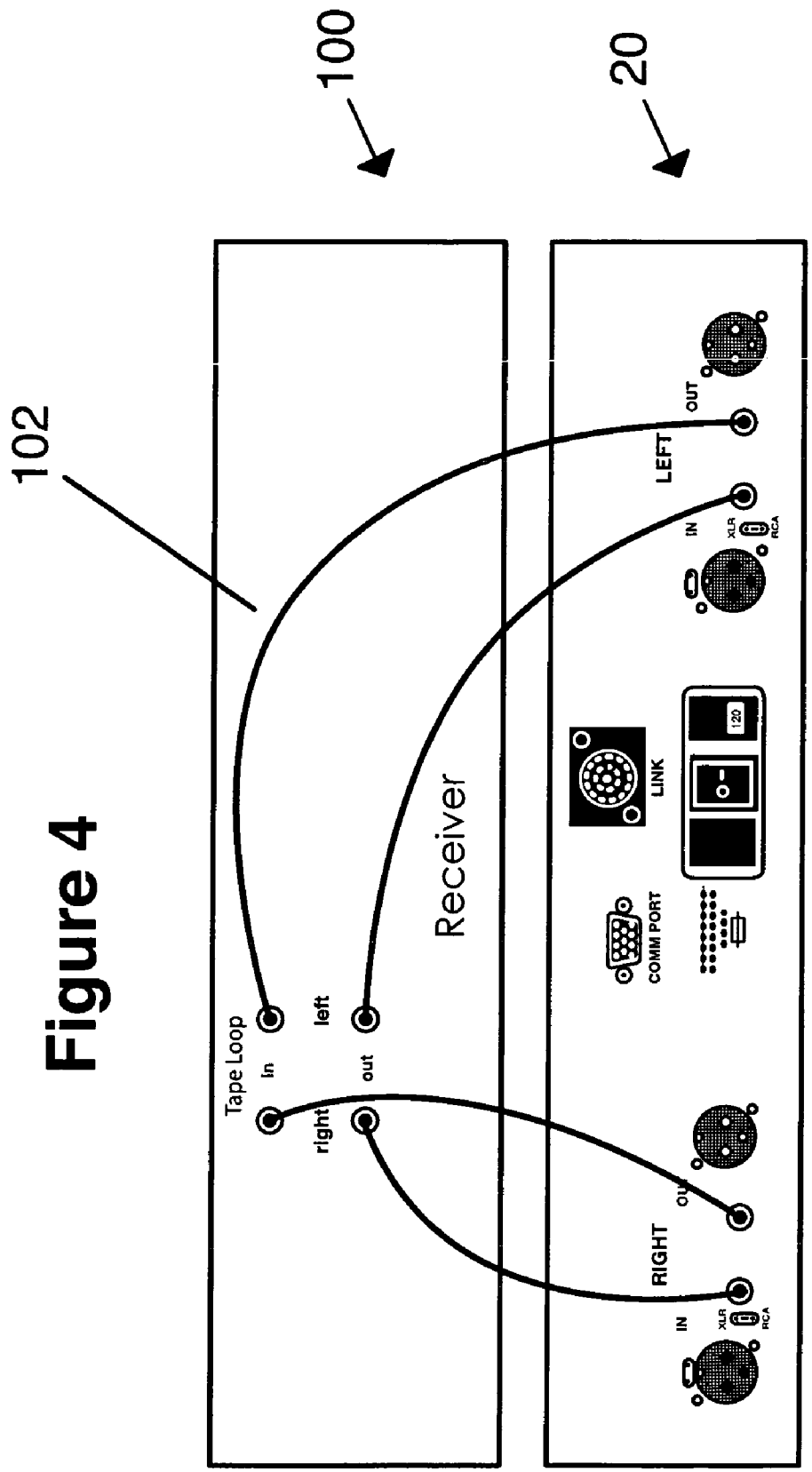
FIG. 4 is an alternative preferred method of connecting the device in a home audio system.
Figure 5:
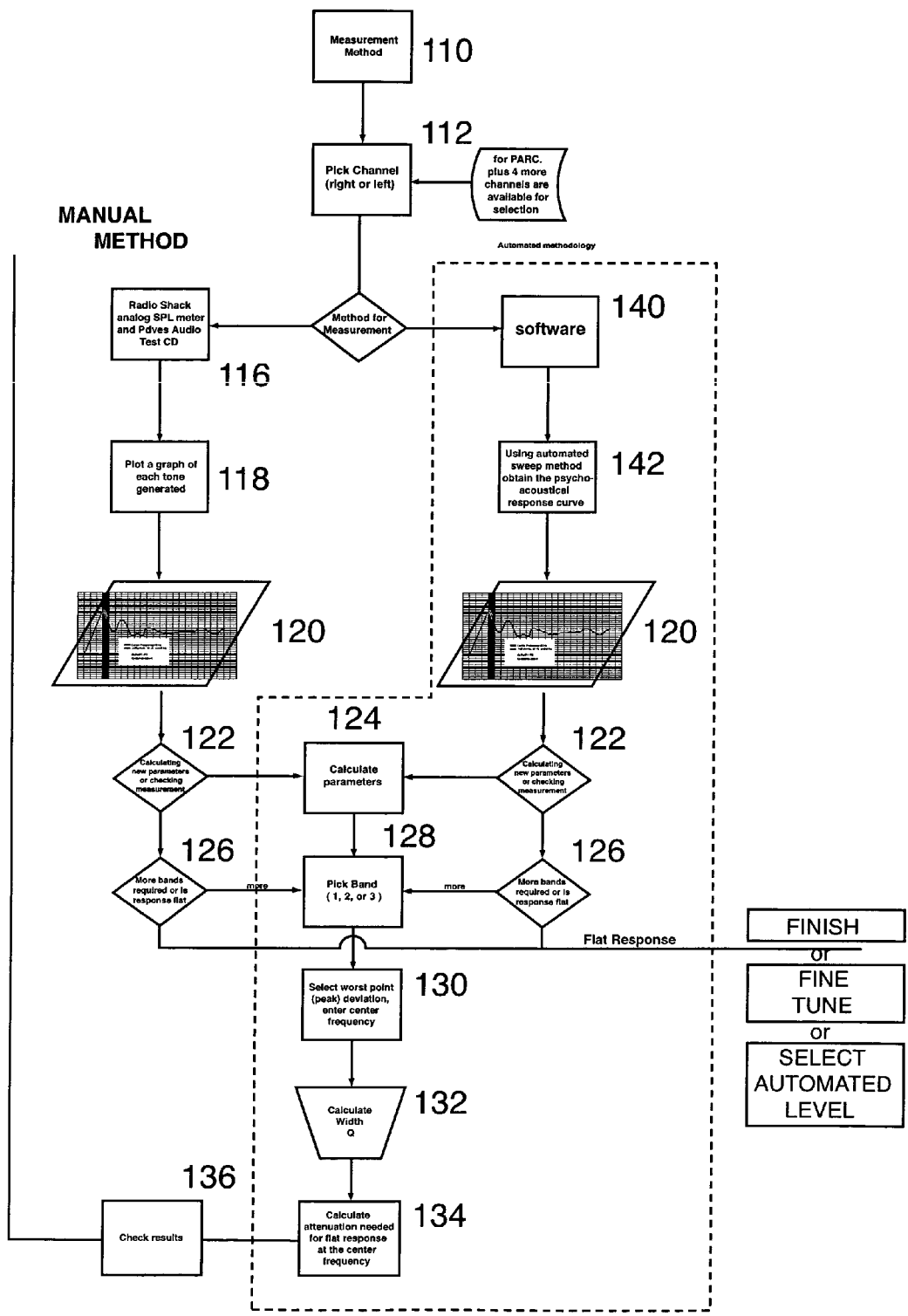
FIG. 5 is a flow diagram for a method of compensating for room modes.
Figure 6:
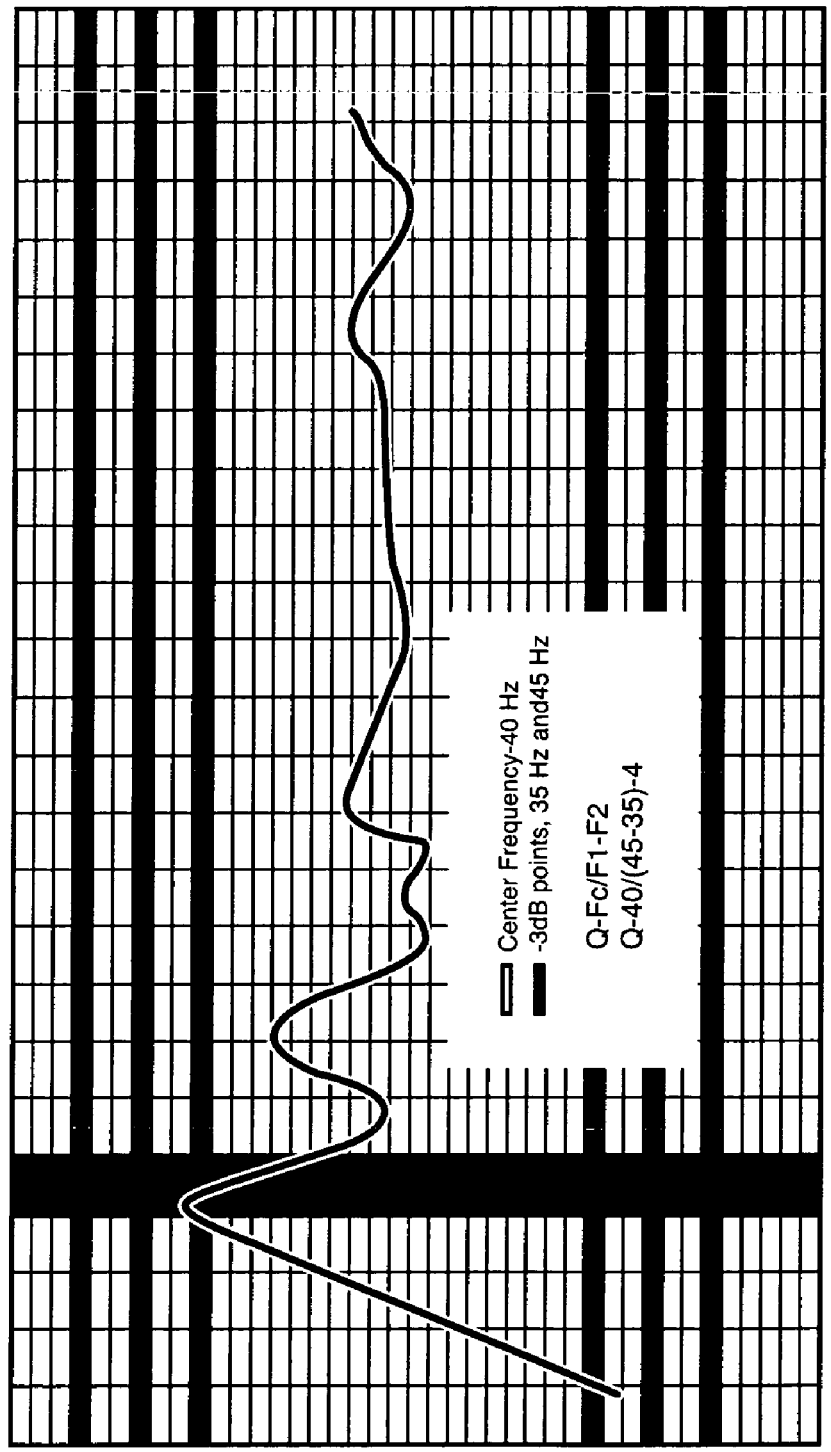
FIG. 6 is an example frequency response of a speaker.

A typical listening room in a home was not designed with that purpose in mind. As a result, the dimensions or geometry of the room often result in a compromised listening environment. Rooms often have parallel walls that accentuate particular frequencies based on the size (length, width and height) of the room.

There are axial modes that are excited between each pair of surfaces. The axial mode is the resonance associated with each pair of walls. The frequency of the first axial mode occurs where ½ of the wavelength travels the distance between the two walls in 1 second. The second axial mode is a harmonic of the first axial mode and is twice the frequency of the first axial mode. A typical room 10 has axial modes 12a, 14a, 16a caused by the parallel walls along its length 12, width 14 and the floor 16 and ceiling.

For a room 30 feet long by 15 feet wide, the first axial mode for the length is approximately 18.8 Hz. The second axial mode for the length is approximately 37.6 Hz. The first axial mode for the width is approximately 37.6 Hz. There is a rise in energy at each axial frequency. This is more pronounced, when as in the sample room, two axial modes are at the same frequency or when they are close to the same frequency.

The size of the energy rise and the width over which the rise occurs (the width of the band) are impacted by the construction of the walls. A concrete block room might have as much as a 15 db peak over a very narrow bandwidth; whereas room with single layer gypsum and 2×4 construction might only have a 6 db peak and a much wider range.

The present invention is an analog parametric equalizer 20 that compensates for room modes 12a, 14a, 16a. The device controls for the standing waves 12a, 14a, 16a caused by a room's parallel walls, 12, 14 and floor/ceiling 16 by allowing for attenuation over a range of frequencies focused about a center frequency.

The device has three adjustable variables. The three adjustments that are made for each band are center frequency, Q or quality factor, and attenuation. Preferably, there are at least two channels. In an alternative embodiment, there are a plurality of channels. This would be useful in a home theater situation where 2, 4, 6 or even more speakers are used. For example, a 6-channel device would be useful for a home theater with 6 speakers. Each channel can be adjusted individually. Preferably, each channel has a plurality of bands, which can be individually adjusted. Preferably, each of the three variables can be adjusted individually for each band.

The inventive device functions to minimize bass anomalies in the room. The most prominent anomalies occur when two parallel walls (or floor and ceiling) excite a particular frequency. Given typical room sizes, this is generally in the bass range. The distance between the two walls determines which frequency is excited. The most problematic, or highest amplitude, frequency is generally a first axial mode of the room's width, height or length.

The first axial mode is located at the distance that ½ of a wavelength travels in one second between the two walls. The speed of sound is approximately 1130 feet per second. Thus, a room with 17 foot spaced walls has a frequency bump at about 33.2 Hz. This is considered the first mode between those two walls.

The second mode is for a full wavelength, which would be at 66.4 Hz. The third mode would be at 3/2 wavelengths, or 99.6 Hz. Each mode has lower amplitude than the previous mode. However when the room length and width of multiples of each other or have a common multiple, the axial modes combine to create an even stronger anomaly.

In a room when the length is twice its width, such as a room 34 feet long for the above example. The first mode for that room is at the same frequency of the second mode of the width, or 66.4 Hz. When modes combine, the problem is compounded, and the bass becomes very bloated and distorted.

It is preferable to reduce any bass anomalies as much as possible before employing the inventive device. Appropriate room dimensions can minimize bass anomalies. However, changing the room dimensions is impractical and in many cases is impossible. Another method of reducing bass anomalies is to provide damping or to add bass traps to the room. Over damping room, or filling it with bass traps is impractical, expensive, and does not necessarily lead to an improved listening environment.

The device uses a short signal path to compensate for bass problems this results in minimal effect on anything else in the audio chain.

The device preferably operates to attenuate frequencies between 16 and 350 Hz. This will allow users to address room mode problems caused by parallel walls separated by about 1.6 to about 35.6 feet. More preferably, the device operates to attenuate frequencies between 16 and 200 Hz caused by room excitation.

Preferably, the device has three bands 22 per channel 24. These three bands compensate for the three parallel surfaces in most rectangular rooms (side to side, front to back and floor to ceiling). However, the bands can be cascaded or used in a variety of settings to best suit the problems of the room. For example, using two bands to attenuate the same frequency will allow for additional attenuation.

For each band there are three adjustable settings: frequency, attenuation and width. Frequency is the center frequency that will be attenuated. Typically, the first center frequency is the most problematic frequency, i.e. the frequency with the highest peak. Center frequency is represented in Hz. Attenuation is the decrease in loudness or dB desired. The attenuation number is positive, but its function is to reduce the amplitude at that frequency by a number of decibels. Preferably, the user can reduce the loudness by 0 to 18 dB. If the attenuation is set to zero, then no attenuation is employed. If greater than 18 db reduction is desired, the user can attenuate the same frequency more than once using different bands. Width is the frequency range, centered about the center frequency that will be attenuated. Width is expressed by a Q factor, or "quality" factor. The width that needs to be attenuated will change depending on what types of walls, floor, or ceiling etc. the user has. In general hard, rigid surfaces, such as concrete, need to be attenuated over a narrower range of frequencies than less rigid surfaces such as sheetrock on wood studs. The Q factor is expressed as:

$Q$=Center Frequency (Hz)/Width (Hz) at 3 dB below the peak frequency

The higher the Q factor, the narrower the band of attenuation and the lower the Q the wider the band of attenuation.

For example, a center frequency at 100 Hz with a width of 25 Hz 3 db below the peak would have a Q factor of 4. Q factor can also be expressed in terms of octaves. Q factor is inversely proportional to the octave width. One octave doubles the frequency. Frequency is a log function of octaves, so a center frequency of 100 Hz with a width of one octave is not precisely 100 Hz. In our example of 100 Hz center frequency and a width of 25 Hz, the relative octave width is approximately ¼ and the Q factor is 4.

Q factor can preferably be adjusted between 1 and 10. The lower the Q factor the broader than range of attenuation. A Q factor of 1 is much broader range of attenuation than is typically needed. A Q factor of 10 provides the narrowest attenuation range.

Preferably, the device has both balanced and single ended inputs and outputs. Preferably, the device has RCA 44, 46 and/or XLR 40, 48 inputs and outputs. Preferably, balanced connections are used. The device may also be used to convert from balanced to single ended and vise versa. Preferably, the device has a power off bypass. The device can either be connected via a tape loop 102 or between pre-amp outs and amplifier in 80.

In a first preferred embodiment, the device is connected between a separate amplifier 60 and pre-amp 62. When connecting the device between a pre-amp 62 and an amplifier 60, the line in on the device 20 is connected to the outputs on the pre-amp 62. The line out on the device 20 is connected to the inputs on the amplifier 60. Balanced connectors, single ended inputs, or a combination could be used. The user should select the switch 42 position either RCA 44, 46 or XLR 40, 48.

In a second preferred embodiment, the device is connected to the audio system via a tape loop 102. The line in on the device is connected to the tape record outs on the receiver 100 or pre-amp. The line out on the device 20 is connected to the tape in on the receiver 100 or pre-amp. Preferably, single ended inputs are used with a tape loop 102. When using single ended inputs the input switch 42 must be switched to RCA 44, 46 on the back panel. It is also possible to use the XLR, balanced connections, or a combination of the two.

Preferably, the device includes at least one communication port. More preferably, it includes at least two communication ports. Preferably, one communication port uses 6-pin XLR connector 52. Preferably, a second communication port is a standard RS-232 port 50. Other known ports can be used. This allows a computer (not shown) to communicate directly with the device 20. In one embodiment, a computer or other electronic device is used to set the device 2b automatically. In another embodiment, the device includes an integrated processor or computer.

Preferably, the device power cord (not shown) is detachable to allow the user to upgrade the power cord. The power cord is connectable to the device 20 at connector 54.

Display 21 is preferably an LED display. The variables are input using buttons 22, 24, 26, 28, 30, 36, 38. Preferably, the buttons 22, 24, 26, 28, 30, 36 are not functional if the display 21 is off to prevent accidental adjustment of the settings. Preferably, there is a display button 38 that permits the user to turn on the display to review the settings or when changes are desired. The adjustments could be made with dials, touch pads or other known input devices.

For each channel 22 up to three peak frequencies can be attenuated. For each of these bands 24, the three adjustable settings 26, 28, 30 can be adjusted individually. Each of the adjustable settings is preferably continuously adjustable to allow for fine-tuning.

The system is preferably a multi-band system. More preferably, the system has at least three bands. Most preferably, the system has three bands to correct the three most prominent axial modes, typically from the length 14, width 12 and height 16 of the room. Three bands of correction allows for a clear circuit and good transparency.

Because it is preferably to have as little electronic equalization as possible, it is preferably that bass anomalies be reduced as much as possible before employing the inventive device and method. Although it is preferably to reduce the base anomalies first, it is not necessary. The device can be used to compensate for room modes without utilizing a change in room dimensions, without adding damping and/or without adding bass traps. To compensate for room modes, the user first determines the most troublesome frequencies 130. Room and/or speaker response is measured for each channel 112. For each channel, up to three bands can be used to compensate for the bass anomalies.

In a manual embodiment, the room and speaker response is measured 116 using a microphone or meter placed in the preferred listening location 15. A series of frequencies are generated and the frequency response of the speaker 11 or channel is measured. Preferably, the frequency response the speaker 11 is plotted on a graph 118. In one embodiment, the speaker response it automatically plotted on a graph 142.

The center or peak frequency is determined for at least one band 128. Preferably, the anomaly with the biggest peak 130 is the first center frequency addressed. Additional center frequencies can be determined and adjusted for. The anomaly with the second largest peak is the generally second center frequency. Alternatively, the same center frequency can be used for more than one band.

An average width or Q factor is determined for the center frequency 132. The width of the peak 3 dB below the maximum peak is used. The Q factor is determined by dividing the maximum peak by the width. Frequencies having a peak less that 3 dB above a reference level are generally not noticeable. Thus, it is generally not necessary to filter or attenuate frequencies with a peak less than 3 dB above a reference level.

The attenuation needed for a flat response is the next variable determined 134. The attenuation needed for a flat response is the difference between the peak and a reference frequency. The reference frequency is an average frequency. For example, a signal noise between 1000 and 4000 Hz is played and the average frequency is measured.

Figure 7:
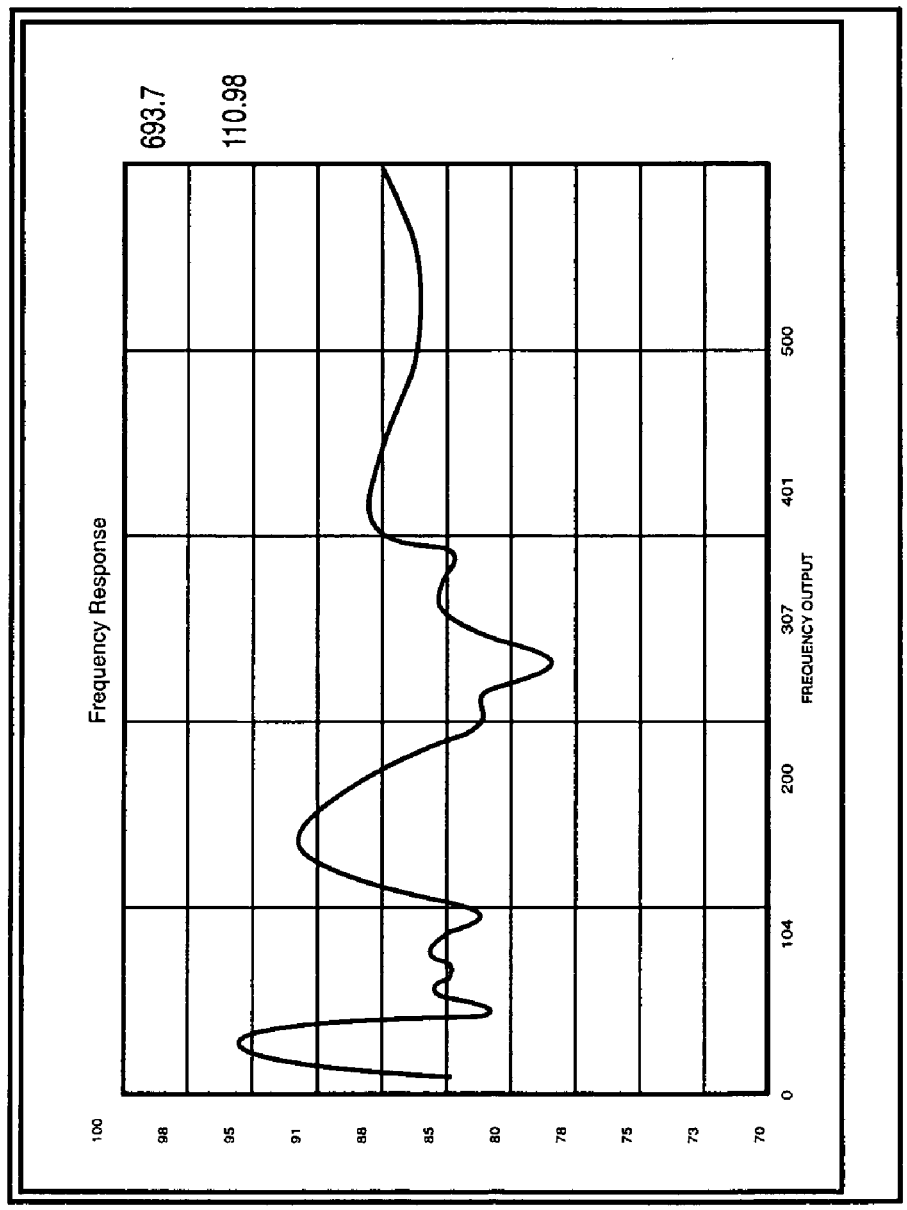
FIG. 7 is an example uncorrected response.
Figure 8:
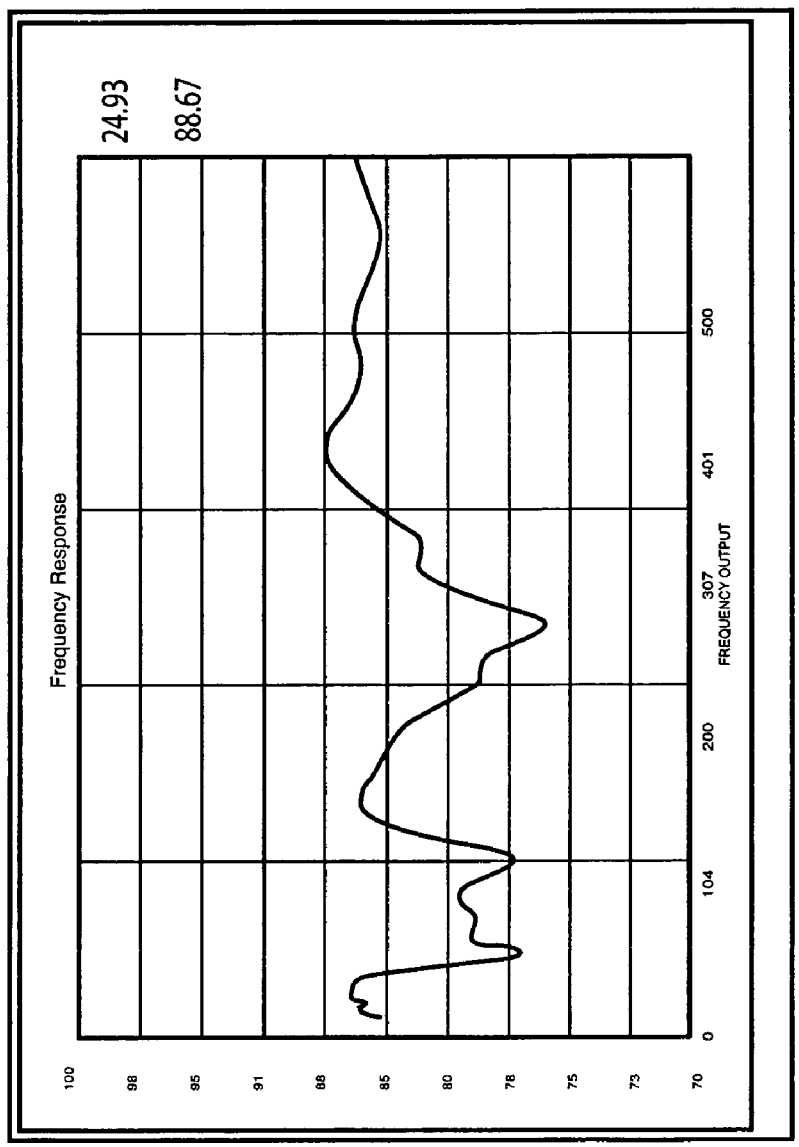
FIG. 8 is a corrected response of the same channel as FIG. 7.

FIG. 7 shows an exemplary response of a speaker before attenuation. There are peaks at about 40 Hz, 100 Hz and 315 Hz. The largest anomaly is at 40 Hz. The 40 Hz anomaly has a bandwidth of about 10 Hz 3 db below the peak. Accordingly, Q=40/10=4. The attenuation needed for the 40 Hz anomaly is 10 db. FIG. 8 shows a corrected response for the same channel as FIG. 7.

Figure 9:
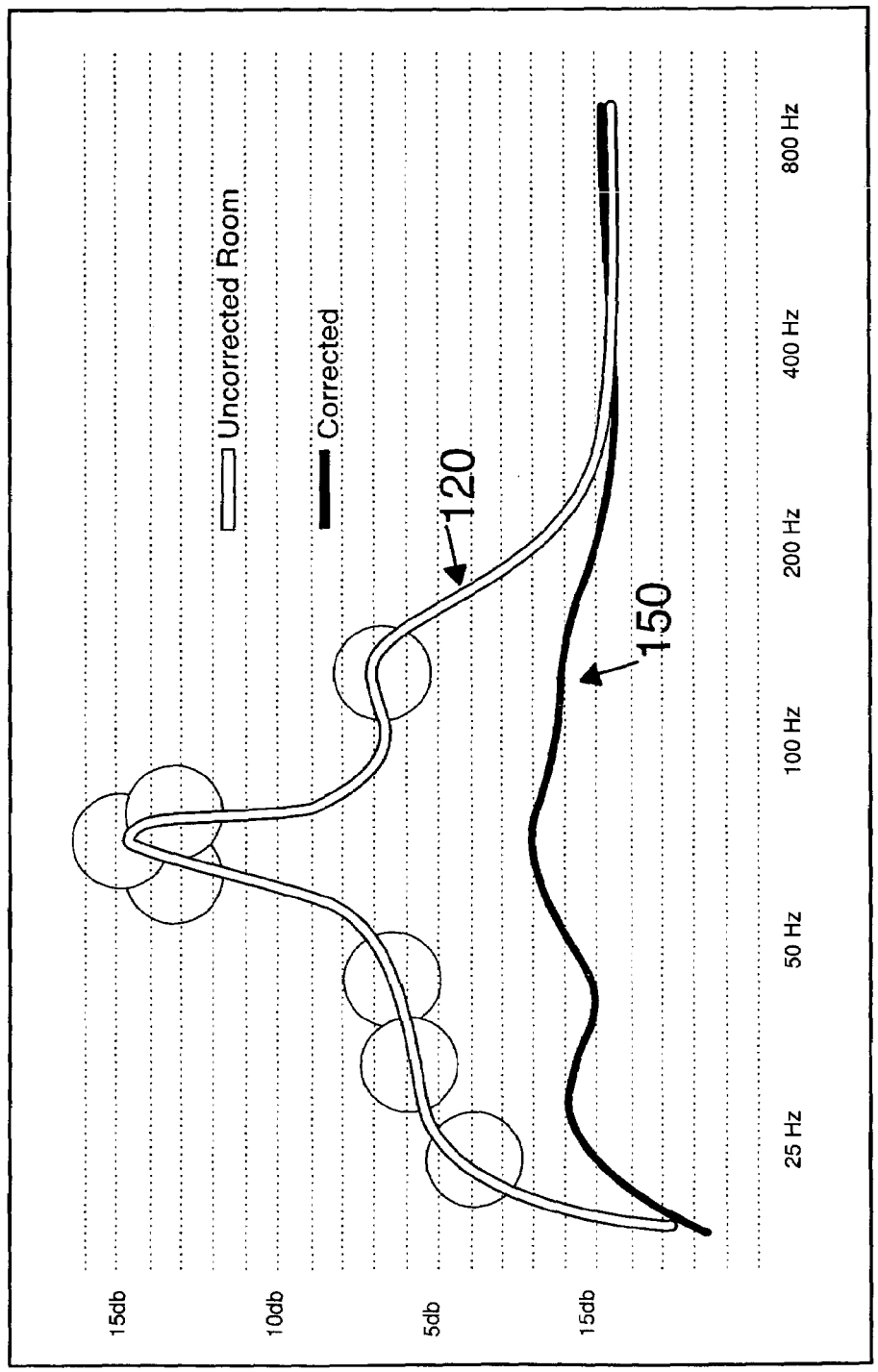
FIG. 9 is a example of a corrected and uncorrected response on a single graph.
Figure 10A:
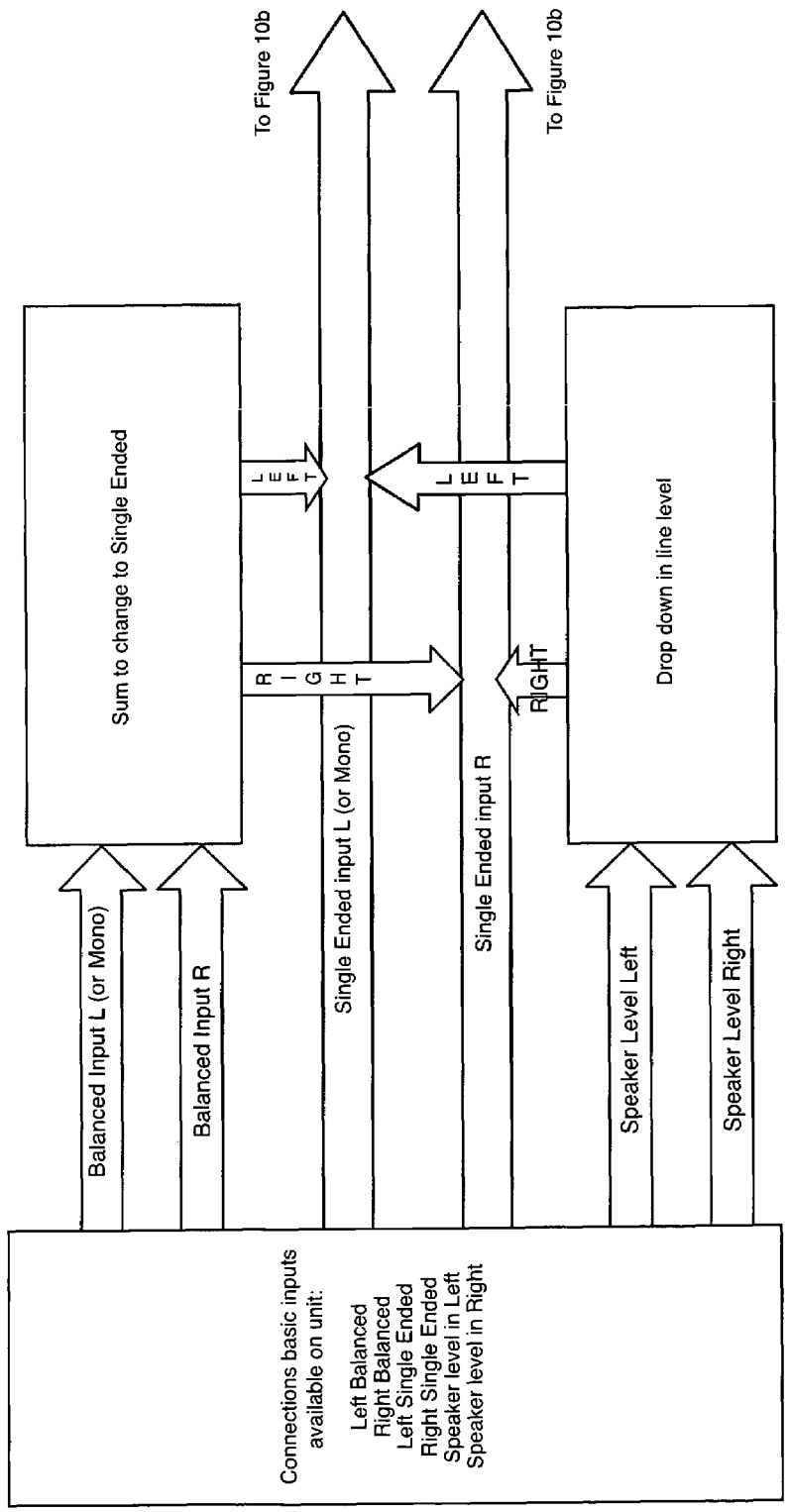
FIGS. 10a-10c are a flow diagram of a preferred embodiment of the parametric equalizer.
Figure 10B:
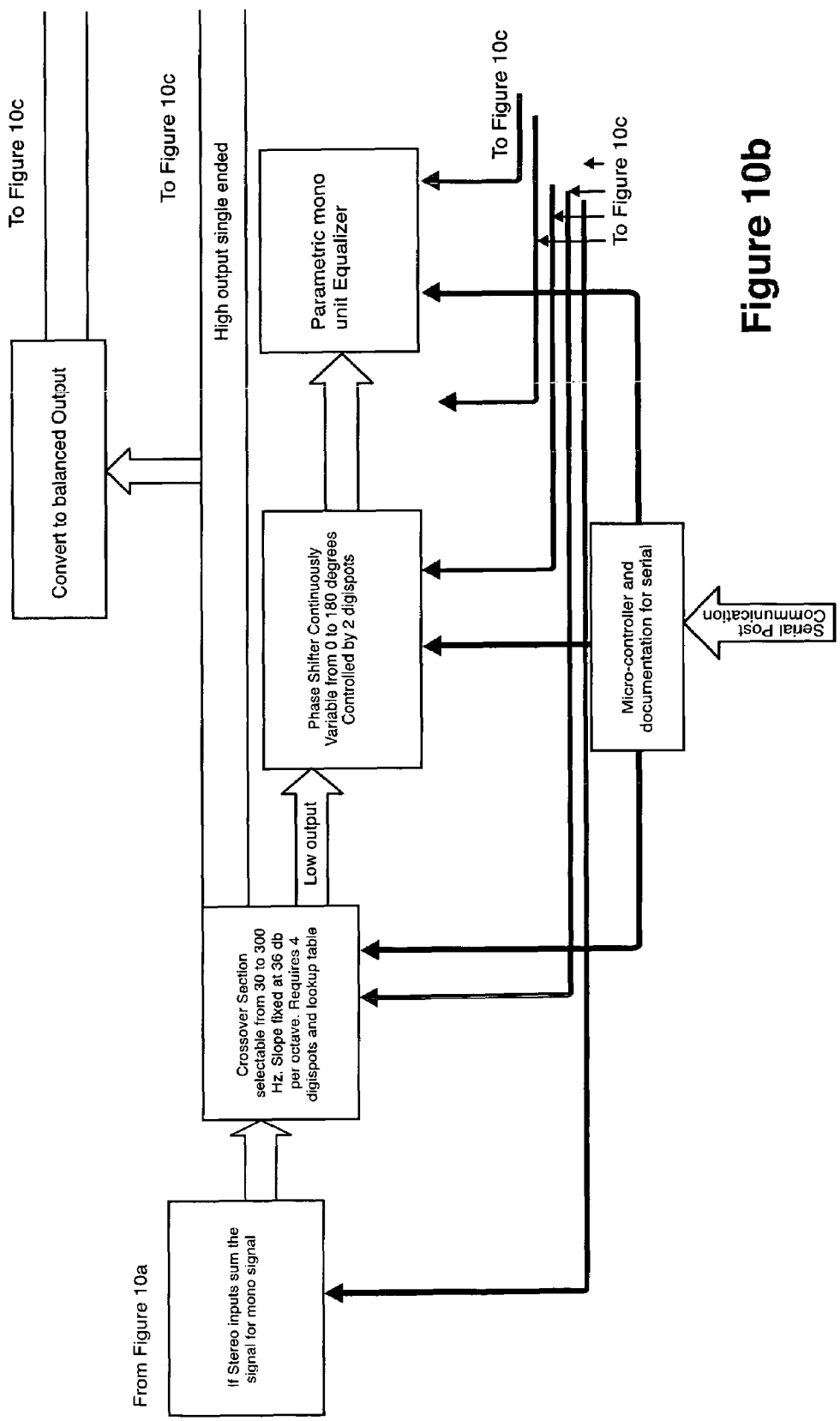
Figure 10C:
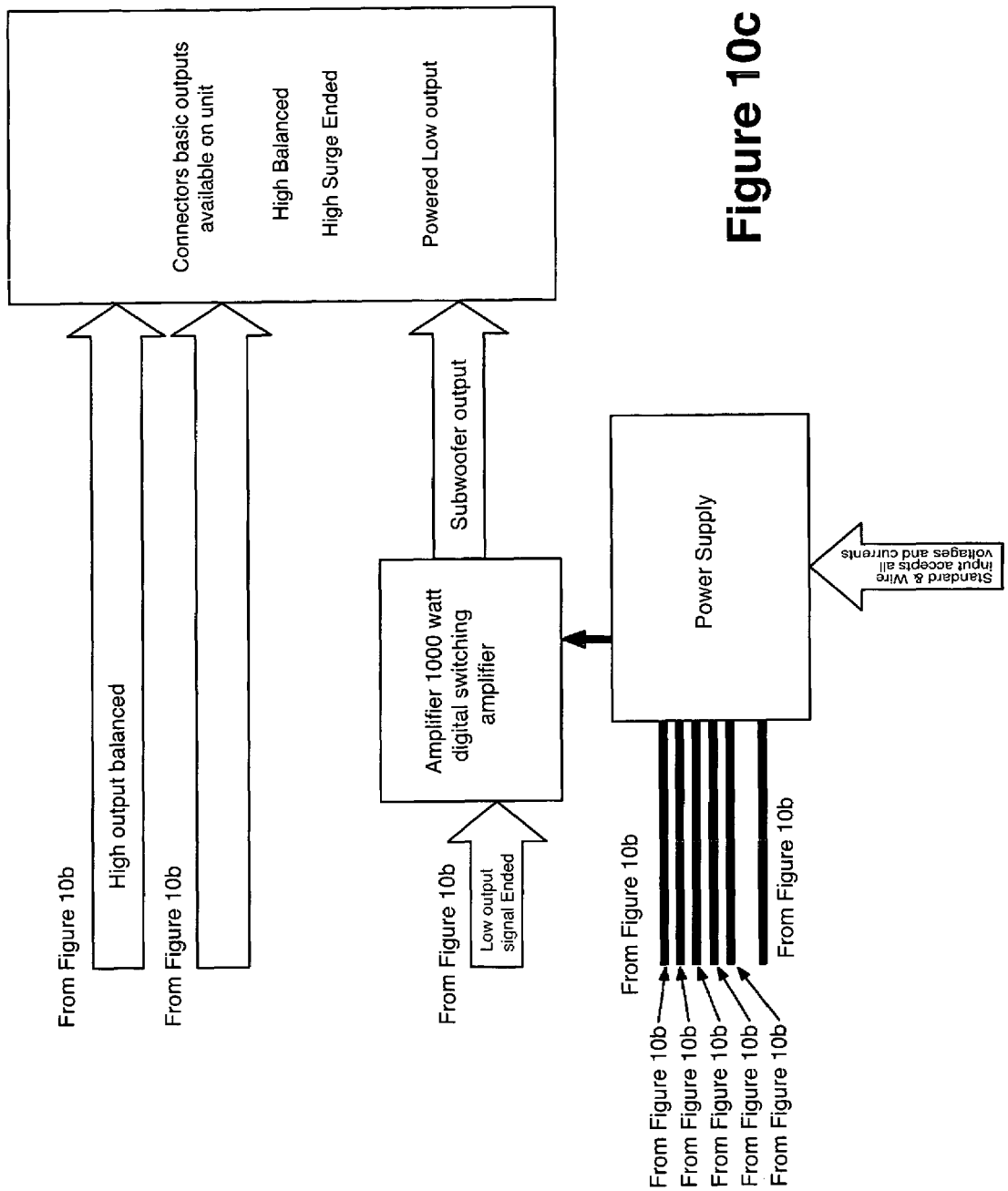
Figure 11B:
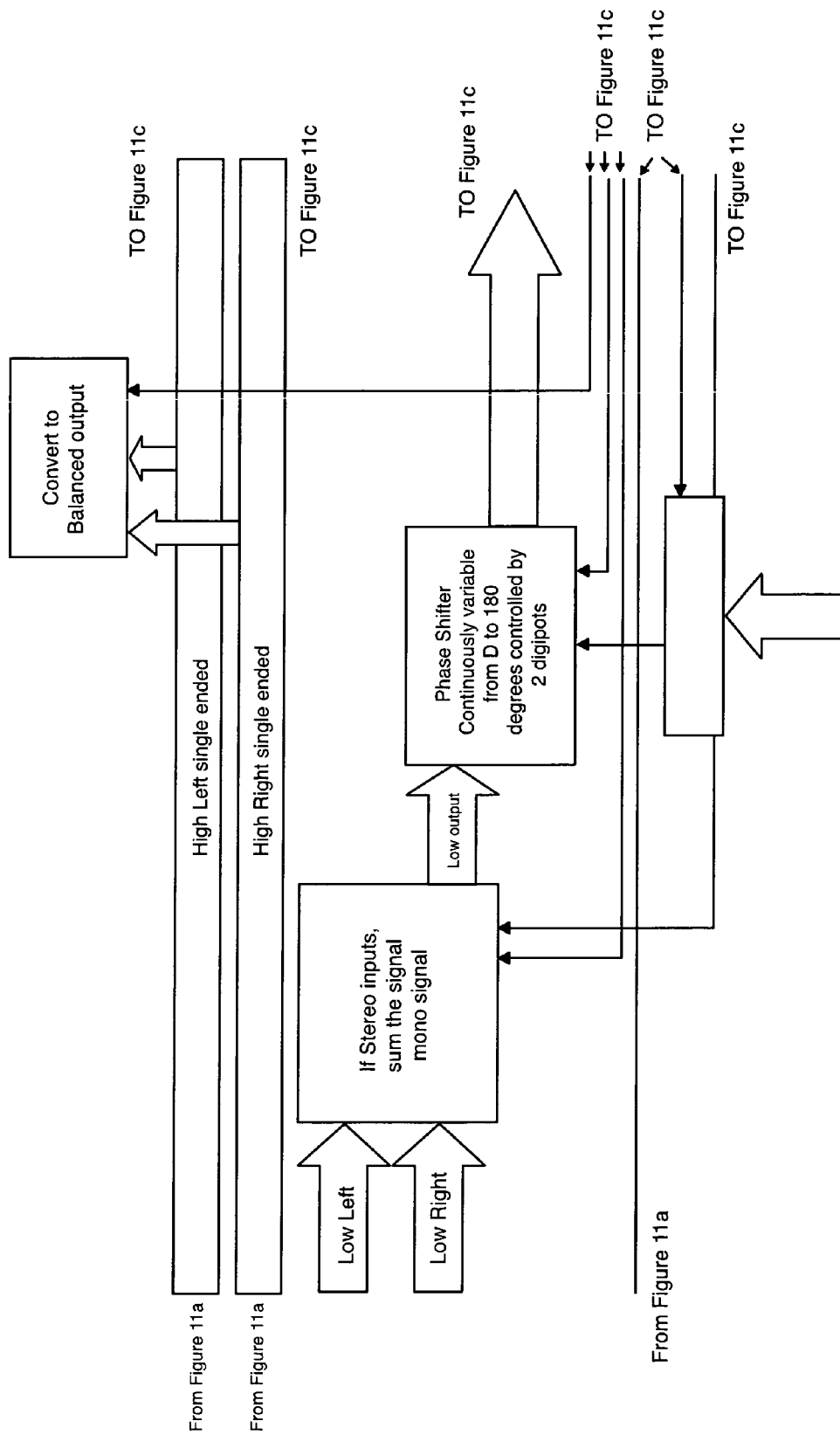
Figure 11C:
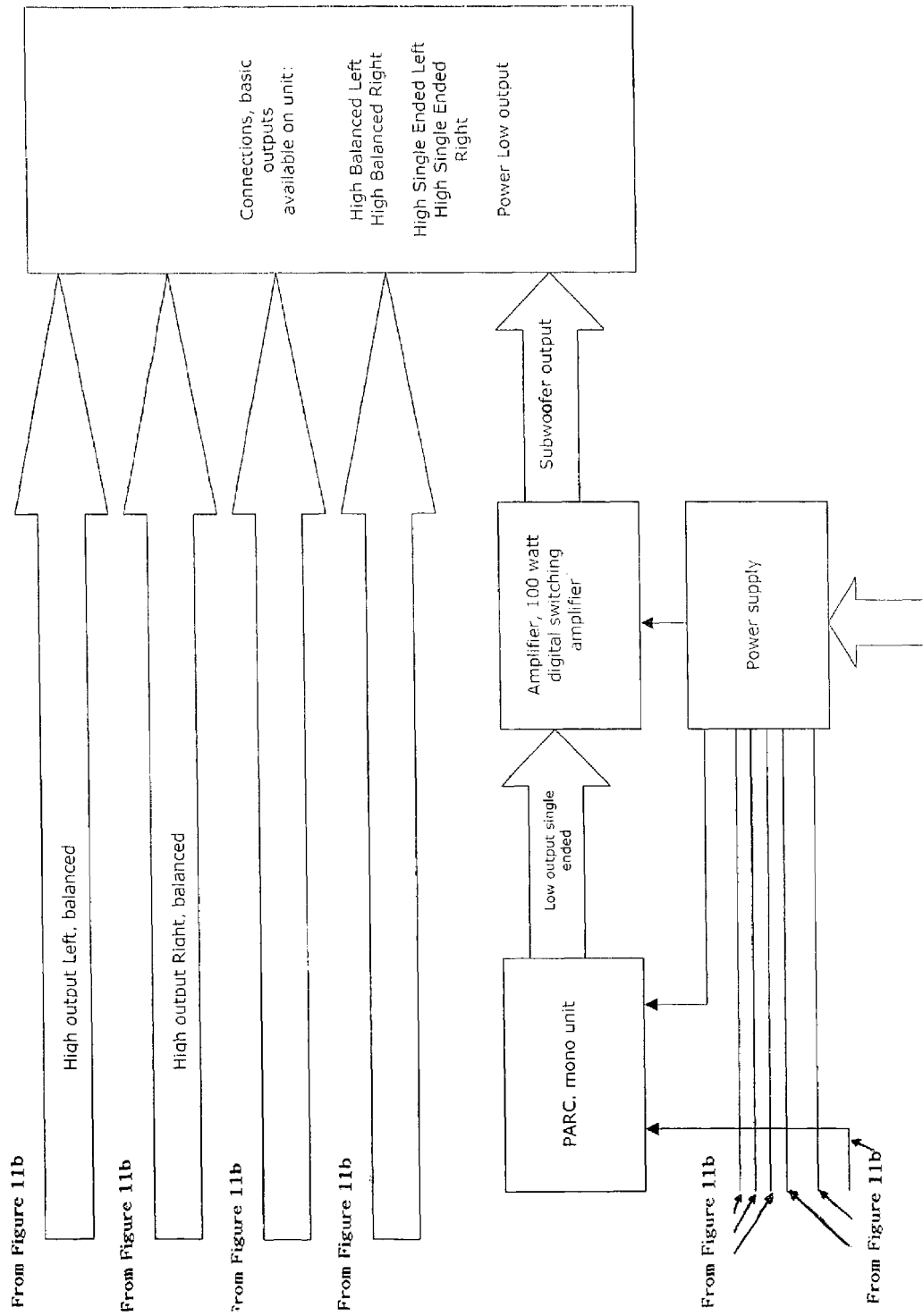
Figure 12:
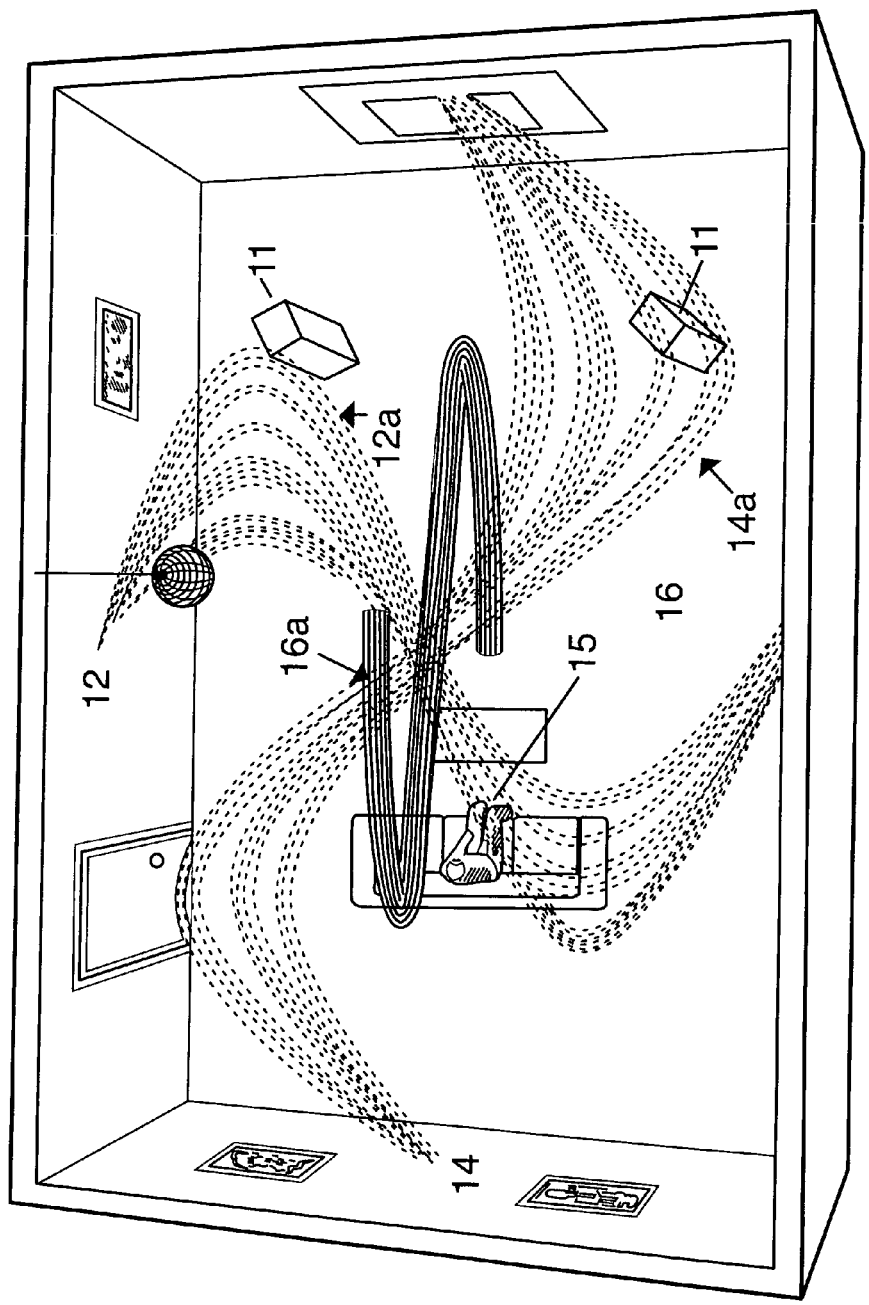
FIG. 12 is a listening room.

FIG. 9 shows the uncorrected and corrected response for a 24-foot by 16-foot room having an 8-foot ceiling.

|  | 1$^{st}$ Axial Mode | 2$^{nd}$ Axial Mode | 3$^{rd}$ Axial Mode |
| --- | --- | --- | --- |
| Height | 70 Hz | 140 Hz | 210 Hz |
| Width | 35 Hz | 70 Hz | 105 Hz |
| Length | 23.5 Hz | 47 Hz | 70.5 Hz |

The additive effect of the first axial mode of the room height, the second axial mode of the room width and the third axial mode of the room length result in a strong anomaly at about 70 Hz. Thus, poor sound is caused by the peaks around 70 Hz in all three dimensions of the room. This large peak results in a "boomy" base and overall poor clarity throughout the frequency range.

The center frequency 26, Q-factor 28 and attenuation 30 are entered into the device 20. To manually enter the variables or to adjust current settings the buttons 22, 24, 26, 28, 30 on the device are used. The channel is selected using the channel button 22. This should correspond to the channel or speaker 11 for which the response was measured. The band is selected using the band button 24. For each band the peak frequency is entered using the frequency up and down buttons 26. The Q is entered using the width up and down buttons 28. The attenuation is entered using the attenuation increase and decrease buttons 30. Preferably, the device 20 attenuates only. Preferably, the device 20 does not have any gain adjustment.

After the device settings have been set for one band, they can be set for a second band if desired. The second largest anomaly can be corrected for next. The original graph can be used to determine the second largest anomaly. However, it is preferable to check the results 136 that have already been entered for a flat response and to again determine the current largest anomaly by running the test frequencies and plotting and generating a new graph of the tones before setting the variables for a second band.

If the response is flat, no further correction is necessary. It is not necessary to use all the bands.

If the response is not flat, an adjustment can be made to the second band of the device. The current worst point deviation is preferably selected. This most often but not necessarily is a different frequency than the center frequency of the first band. The Q width is calculated and the attenuation is entered. The results are again checked, preferably by repeating the test frequencies to plot a new graph. If a relatively flat response is still not achieved, the third band can be used to attenuate the worst point deviation. Many listeners prefer a response that is not perfectly flat and may wish to manually fine tune the adjustments. Calculations are made and adjustments entered for each channel or speaker.

Alternatively, the test frequencies can be measured once and three largest deviations can be attenuated.

Referring to FIG. 7, the second largest anomaly is a peak at 100 Hz. The width 3 db below the maximum is 30 Hz. Thus, the Q factor is 100 Hz/30 Hz=3. The attenuation for a flat response is approximately 7 db. These variable can directly entered into the device.

Preferably, the device has more than one memory. The memory settings 36 allow the user flexibility to tailor the sound for particular situations. Preferably, a flat response is set to one memory. It is preferably to set at least one memory to the users preferences. Typically, listeners prefer a system in which the attenuation is about 75% of what provides a flat response. Alternative, memory setting may be set based on the type of music or other preference factors.

In one embodiment, the settings are determined automatically. A processor, computer or other electronic device is used to generate the frequency test 140, measure the response, generate the graph 142, determine the center frequency, width and Q factor and/or set the adjustable variables. Preferably, at least one memory is automatically set for a flat response. Preferably, a least one memory backs off the flat response by providing about 75% of the attenuation of a flat response.

In another embodiment, the settings are determined manually. In another embodiment, the settings are determined automatically, with the user then making fine adjustments manually as desired.

To automatically determine the settings, software is used to measure the frequency response between 20 and 500 Hz. The steady state frequency response, time energy curves, and waterfall plots in this region are measured. In addition, to these measurements, the psycho-acoustic response curve is plotted. Typical steady state responses could be plotted and used instead. However, the psycho-acoustic response curve is preferable for setting up and evaluating the bass response of a room.

Preferably, the software operates with low cost soundcards (such as those in most laptop computers) and with a standard SPL meter. It may be necessary to calibrate the meter. Preferably, the software is already pre-calibrated for a standard SPL meter such as the Radio Shack SPL meter. Preferably, the software couples with the parametric adaptive room compensation device to evaluate the best settings for the device for a flat response, and then automatically transfers the data to the device and stores it in memory location. Alternatively, the system can automatically store a response other than a flat response such as one that provides about 75% of the attenuation of a flat response. If desired, a user can manually adjust the settings determined with the software.

Typically a near flat response in the bass region can be achieved which will allow the entire frequency range to sound much clearer.

In another embodiment, the system automatically stores to memory a flat response and in another memory setting stores a setting that provides about a given response such as one that provides 75% of the attenuation of a flat response.

In another embodiment, the settings are automatically adjusted for a particular type of music or instrument.

In one embodiment, the device has a bypass setting 32 which when engaged allows the listener to hear the system as if the device were not part of the system.

I claim:

1. A method for compensating for room modes comprising the steps of:
   locating a sound measuring device at a single predetermined listening location, which is representative of a predetermined preferred location within a room;
   locating a first speaker at a predetermined preferred first given speaker location within the room;
   generating a first series of frequencies from the first given speaker location;
   at the single predetermined listening location, making a first measurement of the first series of frequencies originating only from the first given speaker location based upon the measurement results of only said first measurement, making a frequency determination of a first center frequency for the first given speaker location, which first center frequency is a frequency in a first largest measured anomaly peak;
   based only upon measurement results of said first measurement, and results of said frequency determination, of said first center frequency, making a single width determination of a single width for the first center frequency;
   based only upon results of said first measurement, said frequency determination, of said first center frequency, and said single width determination, making a single correction determination of a single attenuation needed for a flat response at the first center frequency for a single predetermined listening location;
   entering the first center frequency, the first average width and the first attenuation into an analog, parametric equalizer.

2. The method of claim 1 further comprising the steps of:
   determining at said single predetermined listening location and said first single predetermined speaker location a second center frequency for the first given speaker location;
   determining a single width for the second center frequency;
   determining a single attenuation needed for a flat response, at said second center frequency;
   entering the second center frequency, the single width, for the second center frequency, and the single attenuation, for the second center frequency, into an analog, parametric equalizer.

3. The method of claim 2 further comprising the step of generating a second series of frequencies which is performed before the second center frequency, the single width, for the second center frequency, and the single attenuation, for the second center frequency, are determined.

4. The method of claim 3 further comprising the steps of locating a microphone or SPL meter at a preferred listening location before generating the series of frequencies and plotting a speaker response on a graph, and using the graph to determine the first center frequency, the single width, for the first center frequency, and the single attenuation for the first center frequency.

5. The method of claim 1 wherein the steps are automatically performed.

6. The method of claim 1 further comprising the step of manually fine tuning the first center frequency, the single width, for the first center frequency and the single attenuation, for the first center frequency, independently from one another and entered into the analog parametric equalizer.

7. A method of compensating for room modes comprising the steps of:
   providing an audio system comprising a plurality of audio output channels, each with an independent predetermined preferred speaker location;
   providing an analog parametric equalizer in said audio system configured for simultaneously equalizing drive signals for each of said plurality of audio output channels independently;
   causing a first series of known frequency inputs to be provided only on a first of said plurality of audio output channels and only from a first independent predetermined preferred speaker location;
   at a single predetermined preferred listening location, making a first frequency response measurement of said first series of known frequency inputs originating only from said first independent predetermined preferred speaker location;
   said first frequency response measurement comprising a series of frequency dependent sound pressure level measurements;
   based upon frequency response measurements only including said first frequency response measurement;
   making a first center frequency determination of a first frequency dependent sound pressure level anomaly peak;
   based only upon said first frequency response measurement, making a single width determination of a single width characteristic of said first center frequency dependent sound pressure level anomaly peak;
   based upon said first frequency response measurement, making single amplitude determination of an amplitude characteristic of said first center frequency dependent sound pressure level anomaly peak;

based upon said steps of making a first center frequency determination, making a single width determination, and making a single amplitude determination;

generating a first set of frequency dependent factors, comprising:

center frequency, width and needed attenuation; and configuring said analog parametric equalizer with said set of first frequency dependent factors.

8. The method of claim 7 further comprising the steps of:

after terminating said step of causing a first series of known frequency inputs to be provided only on a first of said plurality of audio output channels and only from a first independent speaker location, then causing a second series of known frequency inputs to be provided only on a second of said plurality of audio output channels and only from a second independent predetermined preferred speaker location;

causing a second series of known frequency inputs to be provided only on a second of said plurality of audio output channels and only from a second independent predetermined preferred speaker location;

at a single predetermined preferred listening location, making a second frequency response measurement of said second series of known frequency inputs originating only from said second independent predetermined preferred speaker location;

based upon frequency response measurements only including said second frequency response measurement;

making a frequency determination of a second frequency dependent sound pressure level anomaly peak;

based upon said second frequency response measurement, making a single width determination of a single width characteristic of said second center frequency dependent sound pressure level anomaly peak;

based upon said second frequency response measurement, making a single amplitude determination of a single amplitude characteristic of said second center frequency dependent sound pressure level anomaly peak;

based upon said steps of making a second center frequency determination, making a single width determination, for said second center frequency dependent sound pressure level anomaly peak, and making an amplitude determination, for said second center frequency dependent sound pressure level anomaly peak;

generating a second set of frequency dependent factors, comprising:

center frequency, width and needed attenuation; and configuring said analog parametric equalizer with said set of second frequency dependent factors.

9. The method of claim 8 wherein said first series of known frequency inputs are substantially equivalent to the second series of known frequency inputs and where said first frequency dependent sound pressure level anomaly peak is the largest sound pressure anomaly peak for said first of said plurality of audio channels and said second frequency dependent sound pressure level anomaly peak is the largest sound pressure anomaly peak for said second of said plurality of audio channels.

10. The method of claim 9 wherein said first frequency dependent sound pressure level anomaly peak is the largest of three sound pressure anomaly peaks for the first plurality of audio channels that is determined and addressed with a correction by inputting settings into the analog parametric equalizer.

11. A method of correcting room mode problems comprising the steps of:

creating a first audio system configuration comprising a first predetermined preferred listening location, a first predetermined preferred speaker location and a flat frequency speaker drive signal without any parametric equalization inputs;

making a first measurement of a series of frequency dependent sound pressure level characteristics of said first audio system configuration;

in direct response to sound pressure level measurements of only said first audio system configuration, determining a first center frequency and a single frequency width characteristic, for said first center frequency, and a single amplitude characteristic, for said first center frequency; and providing a correction based upon said first center frequency and said single frequency width, for said first center frequency, and said single amplitude characteristic, for said first center frequency, as inputs into an analog parametric equalizer.

12. The method of claim 11 wherein the step of determining a first center frequency comprises the steps of determining the largest amplitude peak in a graph of the first measurement.

13. The method of claim 12 further comprising the steps of determining the second largest amplitude peak and an associated single width characteristic, for said second largest amplitude peak, and a single associated characteristic of attenuation needed to address excessive amplitude for said second largest amplitude peak.

* * * * *